United States Patent [19]

Matsuzaki et al.

[11] Patent Number: 4,516,039
[45] Date of Patent: May 7, 1985

[54] LOGIC CIRCUIT UTILIZING A CURRENT SWITCH CIRCUIT HAVING A NON-THRESHOLD TRANSFER CHARACTERISTIC

[75] Inventors: Isokazu Matsuzaki, Hiratsuka; Akira Yamagiwa, Kanagawa; Yutaka Watanabe; Takashi Matsumoto, both of Hadano; Katsumi Yabe, Yokohama, all of Japan

[73] Assignee: Hitachi, Ltd., Tokyo, Japan

[21] Appl. No.: 343,379

[22] Filed: Jan. 27, 1982

Related U.S. Application Data

[63] Continuation of Ser. No. 840, Jan. 4, 1979, abandoned.

[30] Foreign Application Priority Data

Jan. 9, 1978 [JP] Japan .................... 53-562

[51] Int. Cl.$^3$ ................. H03K 19/086; H03K 19/013
[52] U.S. Cl. .................... 307/455; 307/443
[58] Field of Search ............ 307/445, 454, 455, 443, 307/467; 330/252, 259, 261, 301

[56] References Cited

U.S. PATENT DOCUMENTS

| | | | |
|---|---|---|---|
| 3,430,071 | 2/1969 | Sheng ................ | 307/455 X |
| 3,558,914 | 1/1971 | Schmidt .............. | 307/455 |
| 3,629,610 | 12/1971 | Wilhelm .............. | 307/455 |
| 3,655,998 | 4/1972 | Wilhelm .............. | 307/455 |
| 3,764,826 | 10/1973 | Okada ................ | 330/252 X |
| 3,832,575 | 8/1974 | Dasgupta et al. ...... | 307/443 |
| 3,849,735 | 11/1974 | Haenen et al. ........ | 330/261 |
| 3,942,033 | 3/1976 | Swiatowiec ........... | 307/455 |
| 4,135,103 | 1/1979 | Fulkerson ............ | 307/455 X |

FOREIGN PATENT DOCUMENTS 1943205 3/1971 Fed. Rep. of Germany .

OTHER PUBLICATIONS

Ho, "Emitter-Follower Logic Circuit With Simulated Transistor Translation Diode", *IBM Tech. Discl. Bull.*, vol. 12, No. 12, p. 2055, 5/70.
Blumberg et al., "Self-Biased, Low Voltage, Emitter-Followerless Current Switch", *IBM Tech. Discl. Bull.*, vol. 16, No. 3, p. 1017, 8/73.
Erdi, "A Precision Trim Technique for Monolithic Analog Circuits", *IEEE ISSCC, DIG. of Technical Papers*, pp. 192–193, 2/14/75.
Olderdissen et al., "Switchable Reference Level Driver", *IBM Tech. Discl. Bull.*, vol. 18, No. 5, pp. 1409–1410, 10/75.
Cavaliere, "Current Switch Emitter-Follower with Feedback", *IBM Tech. Discl. Bull.*, vol. 11, No. 11, p. 1552, 4/69.
Ahmed, "Zero-Offset Potential Follower Circuits", *RCA Technical Notes*, TN No.: 938, 7 pp., 9/17/73.
*Electronic Design*, vol. 17, No. 11, p. 102, 5/24/69.
Hunter, "Handbook of Semiconductor Electronics", McGraw-Hill, pp. 15-7 to 15-8, 1970, (pub.).

*Primary Examiner*—Larry N. Anagnos
*Attorney, Agent, or Firm*—Antonelli, Terry & Wands

[57] ABSTRACT

A logic circuit (FIGS. 4A, 5A and 6A) comprises a current switch circuit (FIG. 4A) which has a non-threshold transfer characteristic (FIG. 4B), operates in non-saturation region, and is suited to a high speed operation.

The current switch circuit is formed by a pair of transistors (6 or 7, and 8), one of which (6 or 7) receives an input signal at its base, and the other (8) has its base and collector connected in d.c. coupling to each other. The pair of transistors are connected with a common constant current source (9) at their emitters, deliver an output from their collectors, and are so biased as to operate in the non-saturation region.

In the current switch circuit, due to the d.c. coupling between the base and the collector of the other transistor (8), the voltage level of the collector changes linearly in accordance with the input signal of the current switch circuit. This allows for a transfer characteristic having no threshold and a very small delay time between the input signal and the output signal. Moreover, the operation of transistors in the non-saturation region makes possible a logical operation which is high in speed and short in delay time.

17 Claims, 15 Drawing Figures

LOGIC CIRCUIT UTILIZING A CURRENT SWITCH CIRCUIT HAVING A NON-THRESHOLD TRANSFER CHARACTERISTIC

This is a continuation of application Ser. No. 000840 filed Jan. 4, 1979, now abandoned.

The present invention relates in general to a logic circuit for use in digital equipment, and more particularly to a logic circuit which is suitable for use in large scale integration circuits (hereinafter referred to as LSI circuits) and is formed by current switch circuits having a non-threshold transfer characteristic to enable a high speed operation.

For a logic circuit capable of performing a high speed operation, there has been hitherto known a current mode logic circuit (hereinafter referred to as CML circuit) employing bipolar transistors such as shown in FIG. 1A of the accompanying drawings. Various improvements in such a circuit have been disclosed in for example, U.S. Pat. Nos. 3,502,900, 3,751,680 and 3,758,791.

Although it is well known that the logical operation of the CML circuit which is a kind of current switch circuit is based upon the operation of transistors in non-saturation region, the above logical operation will be first explained referring to FIGS. 1A, 1B and 1C. FIG. 1A shows a fundamental CML circuit, and FIG. 1B is a logical symbol thereof. In FIG. 1A, there is shown such a circuit as applied with two inputs A and B and as delivering two outputs with respect to the two inputs, that is, OR output (A+B) and NOR output ($\overline{A+B}$). The circuit consists of a fundamental portion 18 of the CML circuit and a reference voltage generating circuit 19. The fundamental portion 18 includes transistors $Qi_1$, $Qi_2$ and $Qr$ which are respectively indicated by reference numerals 6, 7 and 8. The input signal A is applied to the base of transistor $Qi_1$ through an input terminal 1, and the input signal B is applied to the base of transistor $Qi_2$ through an input terminal 2. A reference voltage, which is generated in the reference voltage generating circuit 19 and imparted to a reference voltage input terminal 5, is applied to transistor $Qr$ as base input. Respective emitters of transistors $Qi_1$, $Qi_2$ and $Qr$ are connected in common with a constant current source 9. Further, the collectors of transistors $Qi_1$ and $Qi_2$ are commonly coupled to each other to be grounded through a resistor $R_1$ indicated by 10. The collector of transistor $Qr$ is grounded through a resistor $R_2$ indicated by 11. According to whether at least one of the input voltages imparted to input terminals 1 and 2 is higher than the voltage imparted to the reference voltage input terminal 5 or not, it is determined whether a constant current to the constant current source 9 passes through transistors $Qi_1$ and $Qi_2$, or through transistor $Qr$. A voltage drop across the resistor $R_1$ or $R_2$ due to passage of the constant current forms a NOR or OR output. That is, on output terminal 4 connected with the commonly coupled collectors of transistors $Qi_1$ and $Qi_2$ there appears an output signal indicated by $O_{NOR}$, while on the output terminal 3 connected with the collector of transistor $Qr$ appears another output signal indicated by $O_{OR}$. Among logical circuits belonging to such a CML circuit as mentioned above, there has been put into practical use a so-called emitter-coupled logic (ECL) circuit which employs a logical amplitude of 0.8 V and in which output signals are as shown in FIG. 2 taken out through emitter-follower transistors 12 and 13 and in which a source voltage $-V_{EE}$ of 5.2 V is employed. The ECL circuit is a circuit suited for use in such an instance that a conventional small or medium scale integration circuit packaged in a case is mounted on a printed wire board. The logical amplitude of 0.8 V is employed to leave a margin for noise which is in such an instance generated in a long connecting wire between chips. Further, the emitter-follower transistors 12 and 13 accompanied with terminal resistors 14 and 15 are provided to drive long connecting wires 16 and 17 between circuits, to clamp collector voltages of transistors $Qi_1$, $Qi_2$ and $Qr$ in FIG. 2 at a predetermined level in "on" condition, and to prevent the transistors from being put in their saturation regions. However, the ECL circuit has such drawbacks that, when operated at a high speed, power consumption becomes large not only in the fundamental portion 18 of the circuit but also in the emitter-follower transistors 12 and 13 and terminal resistors 14 and 15, and that a large number of terminal resistors such as 14 and 15 are required in addition to integrated circuits.

Besides the above-mentioned ECL circuit, there has been proposed and carried out a method of performing logical operation by the CML circuit itself shown in FIG. 1A for use in LSI circuits. According to this method, it is possible to take outputs directly out of the collectors for the following reasons.

(1) Since the CML circuit is lower in noise and is less affected by various parameters such as temperature and applied voltage in the case of LSI packaging than in the case of conventional mounting or packaging, it is possible to employ a small logical amplitude which is about half the conventional amplitude of 0.8 V. The term "LSI packaging" used here implies not only the enhancement of packaging density of circuits on a silicon wafer but also such packaging methods as attaining a much higher packaging density as compared with conventional mounting by arranging integrated circuits on a plurality of ceramic substrates.

(2) In the ECL circuit, the emitter-follower transistors are necessarily employed to prevent transistors $Qi_1$, $Qi_2$ and $Qr$ from being put in saturation region in "ON" condition in dependence upon biasing conditions. The use of a small logical amplitude as mentioned in item (1) can solve the problem of saturation of the transistor, and thus the emitter-follower transistors become unnecessary. Thus, it is evident that, for the case of LSI packaging, the CML circuit, as shown in FIG. 1A, taking outputs directly out of the collectors is advantageous in respect of the small number of circuit elements used and lower power consumption. However, the CML circuit shown in FIG. 1A has various problems as mentioned below.

(1) When there is adopted in the CML circuit such a usual method that a reference voltage is supplied from a reference voltage generating circuit which always generates a voltage of a fixed value, the change-over of current will not start till the input voltage exceeds a constant value. In order to explain the above fact in more detail, there is shown in FIG. 1C the transfer characteristic of the CML circuit. In FIG. 1C, the abscissa and ordinate represent an input voltage and an output voltage in the form of a ratio, respectively. For example, with respect to an output $O_{NOR}$, the output voltage indicated by a ratio is maintained at about 1 till the input voltage ratio is changed to a range of from 0.2 to 0.3. In other words, there will be produced a transmission lag of logical operation corresponding to the period during which the output voltage is left unchanged. The abrupt change in input voltage is required to reduce the transmission lag. That is, it will be impossible to reduce the transmission lag without employing as the input signal a pulse which is short both in rise time and in fall time. It is well known that noise due to reflection, cross-talk, or the like will be higher as the rise and fall times of the pulse are shorter. Therefore, the ordinary CML circuit has a problem that, in the case where a high speed operation is required, restrictions on the mounting or packaging becomes very severe.

(2) The ordinary CML circuit requires, as shown in FIG. 1A, the reference voltage generating circuit 19 in addition to the fundamental circuit 18 of the CML circuit.

In order to solve the above-mentioned problems, there has been proposed as a prior art a non-threshold logic circuit (hereinafter referred to as NTL circuit) as shown in FIGS. 3A to 3C. NTL circuits of this kind are disclosed in for example U.S. Pat. No. 3,787,739. A general description of these circuits will be made with reference to the circuit construction and the characteristic of FIGS. 3A, 3B and 3C. The structural feature of the NTL circuit resides in that the resistance of a resistor Ra is made larger than that of a resistor Rb, and that the operation level of transistors $Qi_1$ and $Qi_2$ is kept within a limited region which is intermediate between saturation and non-saturation regions. Further, the transfer characteristic of the above circuit has such features that a decrease in the output voltage represented in the form of a ratio starts, as shown in FIG. 3C, as soon as the input voltage represented in the form of a ratio is applied, and that there is no threshold in the transfer characteristic. The abscissa and ordinate of FIG. 3C represent voltages similar to those explained with respect to FIG. 1C. Owing to the above-mentioned features of the transfer characteristic, the NTL circuit is advantageous in transmission lag as compared with the CML circuit. However, unlike the CML circuit, the fundamental circuit of the NTL circuit can only provide a single output, and therefore a large number of fundamental circuits are required from the standpoint of logical design in the case where the NTL circuit is employed. Moreover, since, in the NTL circuit, transistors are operated in the vicinity of the saturation region, the operation of the circuit is slow and thus disadvantageous as compared with the case such as operating transistors in perfect non-saturation region. Further, although each unit logic circuit of the NTL circuit is not required to have any threshold, the logic circuit is required, as a whole, to have a certain threshold. Therefore, in the last stage of a group of logic circuits, there is needed the CML circuit of FIG. 1A different from the circuit shown in FIG. 3A. Although in such a circuit construction a very small number of reference voltage generating circuits is required as compared with the case where only the CML circuits are employed, the reference voltage generating circuit cannot be dispensed with.

Further, there have been proposed as modifications of the NTL circuit various circuit constructions other than that shown in FIG. 3A. However, all of these circuit constructions have the previously-mentioned features such that the resistance of the resistor $R_1$ shown in FIG. 1A is made larger than that of the resistor $R_2$, and that the operation level of transistors $Qi_1$ and $Qi_2$ is maintained within a limited range intermediate between non-saturation and saturation regions.

An object of the present invention is to provide a current switch circuit having a non-threshold transfer characteristic and suited to a high speed operation. Another object of the present invention is to provide a CML circuit which has a non-threshold transfer characteristic and is operated perfectly in a non-saturation region, and in which a high speed operation can be performed without imposing severe restrictions upon the mounting or packaging. A further object of the present invention is to provide a logic circuit suitable for use in LSI circuits which is formed by repeating similar element arrangements due to the fact that there can be realized a waveform shaping circuit having an element arrangement similar to a logic circuit of a fundamental type.

These objects can be attained by a logic circuit of a fundamental type which is a current switch circuit having a circuit construction as mentioned below.

The current switch circuit consists of at least a pair of transistors, one of which is applied with an input signal at its base, and the other has such a connection that its base and collector are d.c. coupled to each other. Respective emitters of the pair of transistors are commonly connected with a constant current source, and an output signal is taken out of at least one of the collectors of the pair of transistors. Further, biases of the pair of transistors are set on the condition that each transistor can be operated in a non-saturation region with a view to perform a high speed operation.

In the current switch circuit, since the base and collector of the other transistor are connected in d.c. coupling to each other as mentioned above, the voltage level at the base is fed back to the collector side, while the voltage level at the base follows or depends on that at the emitter. The voltage level at the emitter is the same as that at the emitter of the one transistor which receives the input signal, since the emitters of one and the other transistors are commonly connected with each other. Further, the voltage level at the emitter of one transistor receiving the input signal is varied in accordance with the voltage level of the input signal. As is evident from the above, the voltage level at the collector of the other transistor is varied in dependence on a change in the voltage level of the input signal. Thus, the output signal from the collector side of the other transistor shows a characteristic having no threshold for the input signal, and there is scarcely any delay time between the input and output signals. Needless to say, the above-mentioned circuit is a current switch circuit. Therefore, the output from the collector side of the one transistor receiving the input signal shows also a characteristic having no threshold.

As has been explained in the foregoing, in the current switch circuit, due to d.c. coupling between the collector and base of the other transistor, the voltage level at the base is fed back to the collector side, the current switching operation is thereby controlled, and thus a non-threshold transfer characteristic is obtained. Further, since the voltage level at the collector of one transistor is restricted by the voltage level at the base, it is possible to operate the transistors in a non-saturation region under appropriate biasing conditions without the need of emitter-follower transistors.

With such a circuit construction, it is possible to realize a current switch circuit having a non-threshold transfer characteristic, and it is also possible to provide a logic circuit capable to performing a logical operation having scarcely any delay time by adopting the above-mentioned current switch circuit. Moreover, the high speed operation is obtainable by setting biasing conditions so as to operate the transistors in a non-saturation region. Furthermore, since the current switch circuit is employed as a logic circuit of a fundamental type and also can be operated as a waveform shaping circuit, the logic circuit of a fundamental type and the waveform shaping circuit, both of which are formed by the current switch circuit, can be realized by similar element arrangements. Therefore, the logic circuit employing the current switch circuits is suitable for LSI form.

Now, the preferred embodiments of the present invention will be described with reference to the accompanying drawings in which:

FIGS. 1A to 1C show the construction and characteristic of a conventional CML circuit, in which FIG. 1A is a circuit diagram of the CML circuit, FIG. 1B a logical symbol of the circuit shown in FIG. 1A, and FIG. 1C a graph showing the transfer characteristic of the circuit shown in FIG. 1A where a logical amplitude is 1;

FIG. 3A is a circuit diagram of the NTL circuit, FIG. 3B a logical symbol of the circuit shown in FIG. 3A, and FIG. 3C a graph showing the transfer characteristic of the circuit shown in FIG. 3A when a logical amplitude of 1 is employed;

FIG. 4A is a circuit diagram showing the embodiment of the present invention, FIG. 4B a graph showing the transfer characteristic of the circuit shown in FIG. 4A, and FIG. 4C a circuit diagram showing a modification of the circuit shown in FIG. 4A;

Figure 4A:
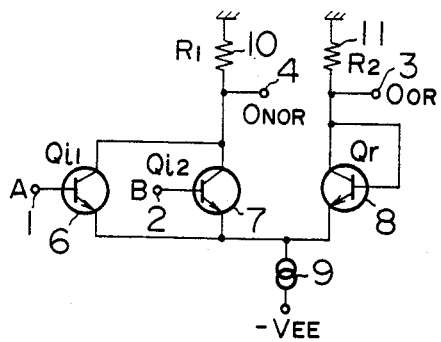
FIGS. 4A to 4C show the construction and characteristic of an embodiment of the present invention, that is.
Figure 5A:
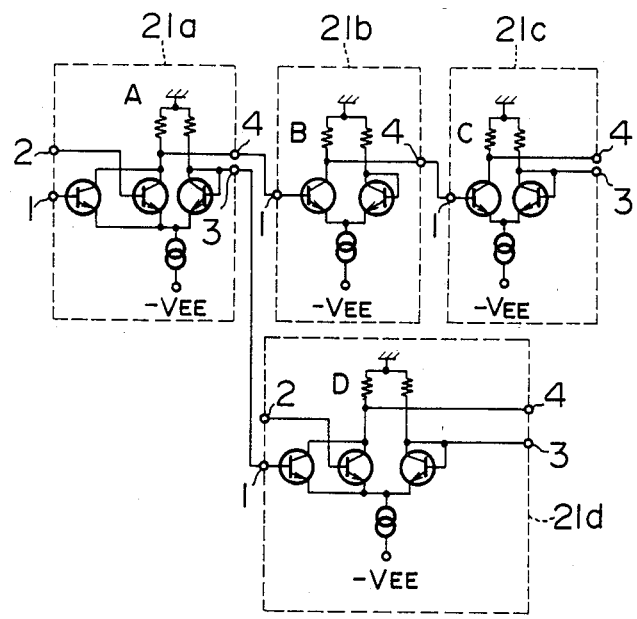
Figure 5B:
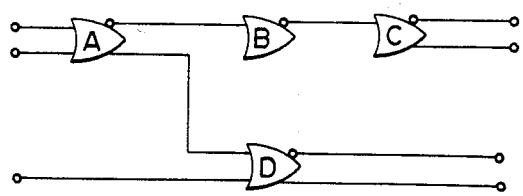
Figure 6A:
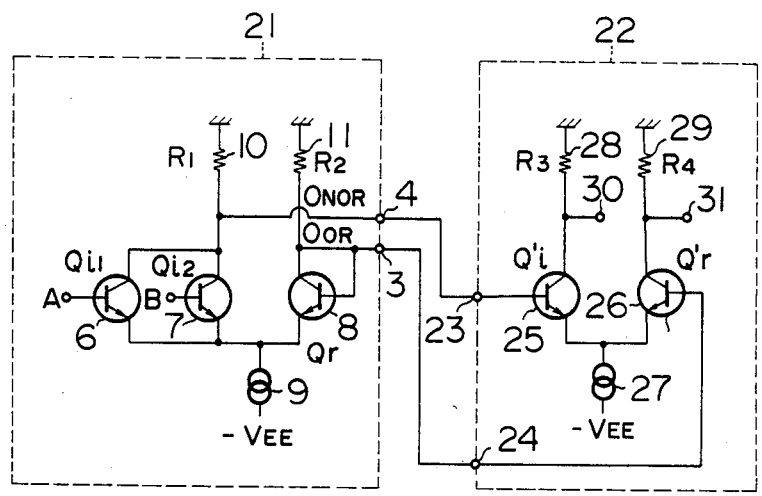
Figure 6B:
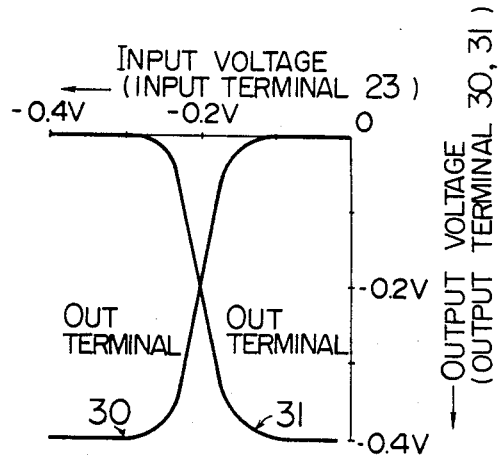
Figure 6C:
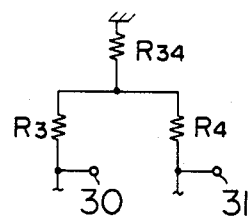

FIGS. 5A and 5B show the construction of another embodiment of the present invention, that is, FIG. 5A is a circuit diagram showing the another embodiment of the invention in which there are connected a plurality of circuits each shown in FIG. 4A and each employed as the logic circuit of a fundamental type, and FIG. 5B a logical symbol of the circuit shown in FIG. 5A; and FIGS. 6A to 6C show the construction and characteristic of a further embodiment of the present invention, that is, FIG. 6A is a circuit diagram showing the further embodiment of the present invention in which the logic circuit of a fundamental type shown in FIG. 4A is connected with a waveform shaping circuit, FIG. 6B a graph showing the transfer characteristic of the waveform showing circuit shown in FIG. 6A, and FIG. 6C a circuit diagram showing a modification of the circuit shown in FIG. 6A.

Referring to FIG. 4A showing an embodiment of a logic circuit according to the present invention, an input signal A applied to an input terminal 1 forms the base input of a transistor $Qi_1$, and an input signal B applied to an input terminal 2 also forms the base input of a transistor $Qi_2$. The emitter of transistor Qr, whose collector and base are directly coupled to each other, is connected to a common constant current source 9 together with the emitters of transistors $Qi_1$, and $Qi_2$. The collectors of transistors $Qi_1$ and $Qi_2$ are grounded through a resistor $R_1$, while, the collector of transistor Qr is grounded through a resistor $R_2$. A supply voltage of $-V_{EE}$ is supplied to the constant current source 9 at its power terminal. Accordingly, an electric power is supplied between the above power terminal and grounded.

In the above circuit construction, if an input signal of a high potential level (approximately equal to the ground potential) is applied to input terminal 1, the potential of the common juncture between the transistors $Qi_1$, $Qi_2$ and Qr and the constant current source 9 is clamped at a value, which is obtained by substracting the forward voltage across the base-emitter junction of transistor $Qi_1$ from the ground potential, for example, 0.8 V. Then, there appears at $O_{OR}$ output terminal 3 a potential which is higher than the clamped level by the forward voltage across the base-emitter junction of transistor Qr, namely, the ground potential, due to the direct coupling between the base and collector of transistor Qr. In short, if transistors $Qi_1$ and Qr have the same characteristic, there will appear on $O_{OR}$ output terminal 3 a potential change approximately equal to a change in the input potential immediately after the change in the input. Further at this time, almost all of the electric current flowing into constant current source 9 passes through the collector of transistor $Qi_1$, and therefore a potential due to the voltage drop across resistor $R_1$, for example, $-0.4$ V appears on the $O_{NOR}$ output terminal 4.

Figure 4B:
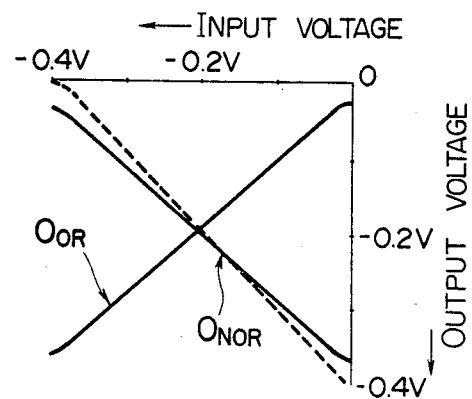

Further, in order to operate transistor $Qi_1$ in its non-saturation region, the resistance of resistor $R_1$, the constant current value and the input and output logical levels are so selected that the collector-emitter voltage drop of transistor $Qi_1$ is, even with a possible variation in the supply voltage and a possible temperature change, greater than the maximum collector-emitter voltage drop of transistor $Qi_1$ when operated in its saturation region. Also, the resistance of resistor $R_2$ is determined to be in the neighborhood of a value which is obtained by dividing the logical amplitude by the value of the constant current to suppress the shift of the logical level of the NOR side from the logical level on the input terminal. In this embodiment, a logical amplitude of 0.4 V is selected, and the resistances of resistors $R_1$ and $R_2$ are so set as to be approximately the same in a range satisfying the above-mentioned necessary conditions and such as to operate all of the transistors in the non-saturation region. Thus, the potential appearing on the $O_{NOR}$ output terminal 4 is nearly equal to $-0.4$ V (low level), while the potential appearing on the $O_{OR}$ output terminal 3 is nearly equal to ground potential (high level). When the potential of the input signal applied to input terminal 1 is decreased from high level (ground potential) to low level ($-0.4$ V), an electric current begins to flow through transistor Qr, which has a negative feedback loop, immediately in response to a change in the potential of the applied input signal, and the electric curent having passed through transistor Qi, is decreased by an amount of the electric current passing through transistor Qr. Therefore, respective output potentials appearing on $O_{NOR}$ output terminal 4 and $O_{OR}$ output terminal 3 are almost linearly changed as indicated by the transfer characteristic lines of FIG. 4B. In FIG. 4B, the abscissa indicates input voltage, while the ordinate indicates output voltage. It is needless to say that FIG. 4B shows a transfer characteristic having no threshold. When the potential of the input signal applied to input terminal 1 is decreased to low level ($-0.4$ V), almost all of the constant current flows through transistor Qr. Thus, there appears on the $O_{NOR}$ output terminal 4 a potential (high level) nearly equal to ground potential, while, on the $O_{OR}$ output terminal 3 appears another potential (low level) nearly equal to −0.4 V. In the foregoing description, it is assumed that an input signal of low level is always applied to input terminal 2. It is apparent that an operation similar to the above-mentioned will also be performed in the case where input terminal 1 is always applied with an input signal of low level and input terminal 2 is applied with another input signal of variable level. It is possible to employ, for constant current source 9 shown in FIG. 4A, such a well-known constant current source as connecting a combination of resistor and transistor to negative supply voltage $-V_{EE}$, or such a circuit as connecting a resistor much higher in resistance than resistors $R_1$ and $R_2$ to the negative supply voltage $-V_{EE}$.

In the foregoing, there has been explained such a case that resistors $R_1$ and $R_2$ have the same resistance. However, the resistance of resistor $R_1$ may be a little greater than that of resistor $R_2$. In this case, the potential on the $O_{NOR}$ output terminal is nearly equal to −0.4 V in ON condition of transistor $Q_{i1}$ or $Q_{i2}$, and is equal to 0 V in OFF condition of transistors $Q_{i1}$ and $Q_{i2}$. That is, there appears such a characteristic as indicated by a broken line in FIG. 4B. In the case where resistors $R_1$ and $R_2$ have the same resistance, since the output voltage is, as indicated by solid lines in FIG. 4B, somewhat attenuated as compared to the input voltage, the amount of attenuation cannot be ignored when a large number of logic circuits are combined to form a multistage circuit. Since the output signal on the $O_{NOR}$ output terminal is preferably employed, the attenuation of such an output signal is a serious problem. However, the attenuation of output taken out of the $O_{NOR}$ output terminal can be improved, as shown by the broken line of FIG. 4B, by making the resistance of resistor $R_1$ greater than that of resistor $R_2$.

It is possible to employ resistors which have been omitted in the above-mentioned embodiment. That is, there can be considered such a circuit that resistors $Ri_1$ and $Ri_2$ are respectively inserted between the base of transistor $Q_{i1}$ and the input terminal 1 and between the base of the transistor $Q_{i2}$ and the input terminal 2, and that the resistor $Rr$ is inserted between the collector and the base of transistor $Qr$. These resistors $Ri_1$, $Ri_2$ and $Rr$ are inserted to suppress the oscillation of signals applied to the bases of respective transistors, and each resistance of these resistors is determined by the relationship between the applied signal and the characteristics of the transistors.

Figure 4C:
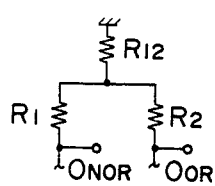

Further, resistors $R_1$ and $R_2$ may be led to ground through a common resistor $R_{12}$, as shown in FIG. 4C. In this case, a constant potential due to a voltage drop across the resistor $R_{12}$ is added to the output potential on each of the $O_{NOR}$ and $O_{CR}$ output terminals.

In the embodiment mentioned above, there has been a logic circuit which includes two input terminals for applying respective input signals to respective bases of transistors $Q_{i1}$ and $Q_{i2}$. However, a logic circuit according to the present invention may include only transistor $Q_{i1}$ to receive a single input signal. Conversely, the logic circuit according to the present invention can include in addition to transistor $Q_{i1}$ and $Q_{i2}$ such transistors as $Q_{i3}$, $Q_{i4}$, . . . , $Q_{in}$ to receive many input signals. Additionally, the logic circuit can take a circuit construction such as employing only either one of the $O_{NOR}$ output on the output terminal 4 and the $O_{OR}$ output on the output terminal 3.

Furthermore, although there is shown in FIG. 4A such an embodiment that the base and the collector of the transistor $Qr$ are directly coupled to each other, the base and the collector may be coupled to each other through a resistor. Since the base is connected to the collector to effect the negative feedback of the base voltage to the collector, d.c. coupling between the base and the collector will be quite sufficient.

FIG. 5A shows an example of a logic circuit in which the logic circuit shown in FIG. 4A is employed as one logic circuit 21a, 21b, 21c, or 21d of a fundamental type and a large number of such circuits are combined to perform a predetermined logical operation. Referring to FIG. 5A, the logic circuit 21a or 21d is a logic circuit of a fundamental type which is identical with the logic circuit shown in FIG. 4A and having two inputs, while, the logic circuit 21b or 21c is a logic circuit of a fundamental type having a single input. FIG. 5B is a logical symbol of the logic circuit shown in FIG. 5A. Input terminals 1 and 2 of logic circuit 21a respectively receive input signals from other logic circuits (not shown). The $O_{NOR}$ output terminal 4 of logic circuit 21a is connected with the input terminal 1 of logic circuit 21b, and the $O_{OR}$ output terminal 3 of logic circuit 21a is connected with the input terminal 1 of logic circuit 21d. The $O_{NOR}$ output terminal 4 of logic circuit 21b is connected with the input terminal 1 of logic circuit 21c, and the output terminals 3 and 4 of logic circuit 21c are connected with input terminals of other circuits (not shown). Further, the input terminal 2 of logic circuit 21d receives an input signal from another circuit (not shown), and the output terminals 3 and 4 are connected with input terminals of other circuits (not shown). As will be known from the example shown in FIG. 5A, logic circuits having a wide variety of functions can be formed by employing a large number of logic circuits 21a, 21b, . . . of a fundamental type and by making an appropriate connection between output terminal 3 or 4 of each of the logic circuits and input terminal 1 or 2 of another logic circuit. Moreover, as can be seen from the circuit construction shown in FIG. 4A, the above-mentioned logic circuit can be formed by arranging repeatedly similar circuits, and therefore is one very suitable for use in LSI circuits.

Furthermore, logic circuits 21b and 21c in FIG. 5A can be replaced by logic circuits of a fundamental type, which are identical with logic circuits 21a and 21d in FIG. 5A, in a manner that unnecessary input and output terminals are respectively applied with fixed potentials. In this case, a desired logic circuit can be realized by arranging repeatedly identical basic-type logic circuits.

FIG. 6A shows such a circuit construction as connecting waveform shaping circuit 22 to logic circuit 21 of a fundamental type which is none other than the logic circuit shown in FIG. 4A. The circuit shown in FIG. 6A is suitable for use in the last stage of a multi-stage circuit which consists of a large number of logic circuits of a fundamental type. In such a case, the logical amplitude of output signal appearing on $O_{NOR}$ and $O_{OR}$ output terminals 4 and 3 will be attenuated as compared with a predetermined logical amplitude of 0.4 V. Waveform shaping circuit 22 is provided to transform a signal having the attenuated logical amplitude to a signal having the predetermined logical amplitude. Input terminals 23 and 24 of waveform shaping circuit 22 are connected with $O_{NOR}$ and $O_{OR}$ output terminals 4 and 3 of logic circuit 21 in the last stage, respectively. Input terminals 23 and 24 are connected with respective bases of transistors $Qi'$ and $Qr'$ (indicated by 25 and 26, respectively). The emitters of transistors $Qi'$ and $Qr'$ are commonly coupled to each other and connected with a constant current source 27. The collectors of the transistors Qi' and Qr' are connected with output terminals 30 and 31, respectively, and are both grounded respectively through resistors $R_3$ indicated by 28 and $R_4$ indicated by 29.

Figure 1A:
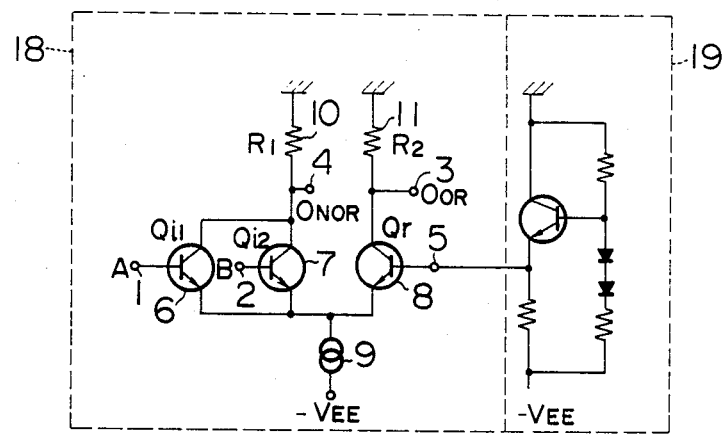
Figure 1B:
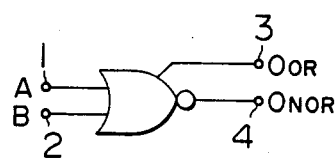
Figure 1C:
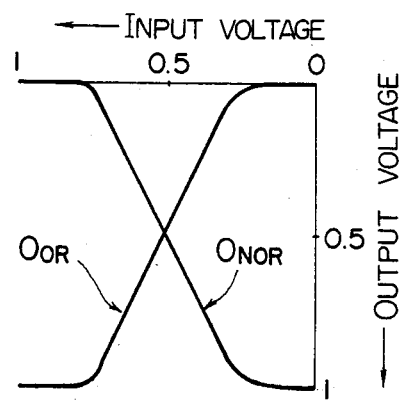
Figure 2:
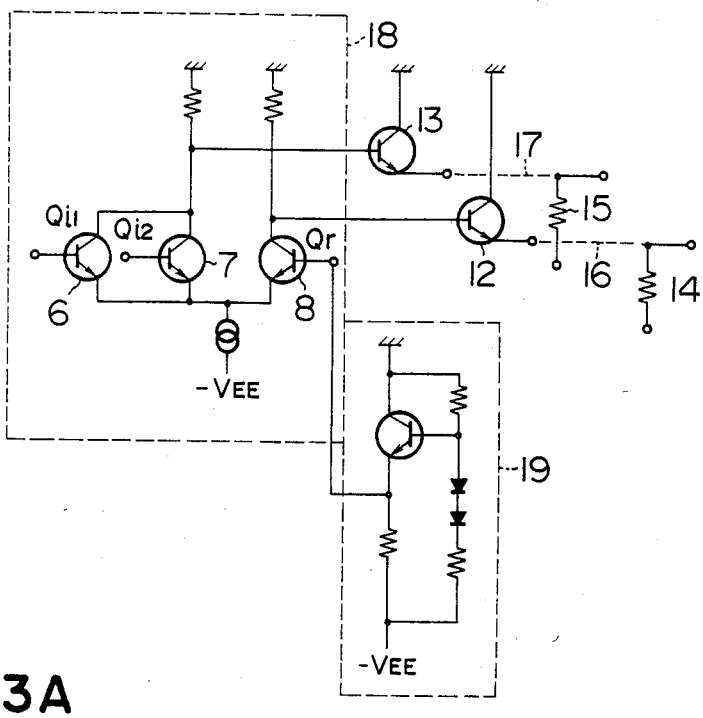
FIG. 2 is a circuit diagram showing a conventional ECL circuit.
Figure 3A:
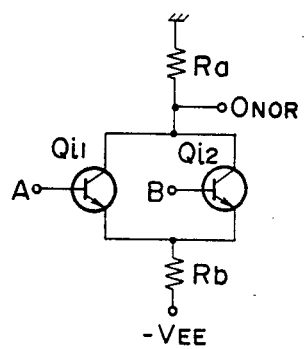
FIGS. 3A to 3C show the construction and characteristic of a conventional NTL circuit, that is.
Figure 3B:
Figure 3C:
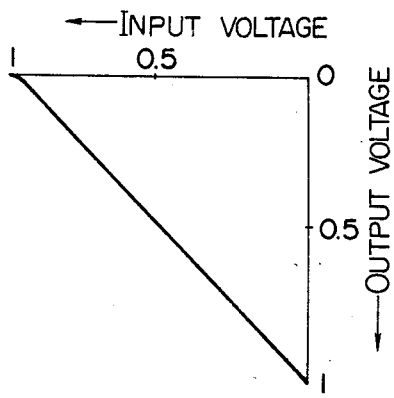

The transfer characteristic of waveform shaping circuit 22 is shown in FIG. 6B. This characteristic is similar to that characteristic of an ordinary CML circuit which is shown in FIG. 1C, but shows a tendency that output voltages can be completely changed in a narrower range of input voltage. This is because signals applied to input terminals 23 and 24 are a pair of output signals from the preceding logic circuit 21 which are opposite in polarity to each other. Therefore, even if the output signal from lotic circuit 21 in the last stage is attenuated to half the predetermined value in both high and low levels, that is, even if the output signal has a logical amplitude between 0.1 V and −0.3 V, the waveform shaping circuit 22 can perform satisfactorily a switching operation.

The waveform shaping circuit has another feature as mentioned below. That is, the circuit has such a self-alignment function that even if the output signal from logic circuit 21 in the last stage is attenuated only in one level (high or low) a satisfactory switching operation can be performed. This is because the difference between high and low levels of the signal applied to the input terminals 23 and 24 is kept unchanged even if some change takes place in the logical level. In this case, the center of potential range of the input signal, where the change-over of current takes place, moves from −0.2 V shown in FIG. 6B toward the level which was attenuated in the output signal from logic circuit 21.

In conclusion, the waveform shaping circuit 22 surely performs a switching operation even if the output from the preceding logic circuit 21 is attenuated to half the predetermined value in both high and low levels or in one of high and low levels. If only the switching operation is performed, there appears on the output terminals 40 output signals which are opposite in polarity to each other and have a predetermined logical amplitude. Incidentally, the polarity of signal appearing at the output terminal 30 of waveform shaping circuit 22 is opposite to the polarity of signal applied to input terminal 23, and the polarity of signal appearing on the output terminal 31 is the same as the polarity of signal applied to the input terminal 23.

Further, the waveform shaping circuit 22 may take such a circuit connection that resistors $R_3$ and $R_4$ are commonly connected and grounded through resistor $R_{34}$, as shown in FIG. 6C. In this case, as is explained with respect to FIG. 4C, a constant potential due to the voltage drop across resistor $R_{34}$ is added to the output voltages on output terminals 30 and 31.

As can be seen from FIG. 6A, the waveform shaping circuit 22 can be formed by a combination of circuit elements which make up logic circuit 21. In other words, the resistors $R_1$, $R_2$, $R_3$ and $R_4$ may have an identical resistance, the transistors $Qi_1$, $Qi_2$ and $Qr$ may be the same in characteristic as the transistors Qi' and Qr', and the constant current source 9 may be the same in circuit construction as the constant current source 27.

Accordingly, all logic circuits can be formed by employing a plurality of groups of circuit elements, one group of which are constituent elements required to make up one fundamental circuit. In making a great variety of logic circuits in the form of integrated circuits, there has been widely employed a so-called master slice approach such that the process for fabricating constituent elements of a fundamental circuit is effected with the same mask, and that only the last wiring process is distinguished by the kind of circuit.

According to the present invention, a predetermined logic circuit can be fabricated at lower cost and with high yield by employing constituent elements of fundamental circuit, and an integrated circuit of the predetermined logic circuit can be realized by utilizing the master slice approach. Further, an integrated circuit, in which a logic circuit according to the present invention is formed, can perform a high speed operation.

Furthermore, since the transmission lag of a logic circuit according to the present invention is independent of rise and fall times of a signal waveform, a signal pulse of a waveform having a gentle slope can be employed not only for signal transmission within an integrated circuit containing a logic circuit according to the present invention but also for signal transmission between such integrated circuits. Therefore, restrictions on the mounting are relaxed, and thereby an apparatus which is as a whole inexpensive and stable can be realized.

We claim:

1. A non-threshold emitter-coupled logic current switch circuit comprising at least a pair of transistors, each of said transistors having a base, an emitter and a collector and being commonly connected to a constant current source on its emitter side, each of said transistors delivering an output signal at an output terminal on its collector side, an input signal being applied to the base of one of said transistors, each collector of said transistors being directly supplied with a constant voltage level through a respective resistor, said resistors being directly connected without any intervening elements to said collectors, and the collector and the base of the other transistor being d.c. coupled directly to each other, wherein said respective resistors of the transistors have resistance values near to each other and a voltage level of the collector of said other transistor changes linearly in accordance with said input signal so that current switching is achieved between said transistors to alternately deliver output signals at the output terminals on the collector side of said transistors in accordance with the level of said input signal.

2. A current switch circuit according to claim 1, wherein said transistors are biased to operate in non-saturation region.

3. A current switch circuit according to claim 2, wherein said current switch circuit further comprises at least another transistor having a base, an emitter and a collector, the collector and the emitter of said another transistor are connected with the collector and the emitter of said one transistor, respectively, and the base of said another transistor receives an input signal.

4. A current switch circuit according to claim 1, 2 or 3, wherein respective collectors of said pair of transistors are connected through respective resistors to a first power terminal of a power supply source, said constant current source is connected with a second power terminal of said power supply source, and said first power terminal is grounded.

5. A non-threshold emitter-coupled logic current switch circuit comprising a plurality of switching transistors, each of said transistors being commonly connected to a constant current source on an emitter side of the transistor, each collector of said transistors being directly supplied with a constant voltage level through a respective resistor, said resistors being directly connected without any intervening elements to said collectors, each of said transistors delivering an output signal at an output terminal on a collector side of the transistor, a collector and a base of one of said plurality of transistors being d.c. coupled directly to each other, and bases of the remaining transistors being supplied with input signals, wherein said respective resistors of the transistors have resistance values near to each other and a voltage level of the collector of said transistor having its base and collector coupled together changes linearly in accordance with said input signals so that current switching is achieved between said transistors to alternately deliver output signals at the output terminals on the collector side of said transistors in accordance with the level of said input signal.

6. A logic circuit according to claim 5, wherein biases of said plurality of transistors are set on the condition that said transistors be operated in the non-saturation region.

7. A logic circuit according to claim 5, wherein the resistance of the resistor coupled to the collector of said one transistor having its collector and base d.c. coupled together is substantially equal to the resistance of each of said resistors coupled to the collectors of each of said remaining transistors.

8. A logic circuit according to claim 5, wherein the resistance of the resistor coupled to the collector of said one transistor having its collector and base d.c. coupled together is smaller than the resistance of each of said resistors coupled to the collectors of said remaining transistors.

9. A logic circuit comprising at least first and second non-threshold emitter-coupled logic current switch circuits, each of said current switch circuits comprising a pair of switching transistors, each of said transistors being commonly connected with a constant current source on an emitter side thereof, each collector of said transistors being directly supplied with a constant voltage level through a respective resistor, said resistors being directly connected without any intervening elements to said collectors, each of said transistors delivering an output signal at an output terminal on a collector side thereof, a base of one transistor of said each current switch circuit being supplied with an input signal, and a collector and a base of the other transistor being d.c. coupled directly to each other, wherein said respective resistors of the transistors have resistance values near to each other and a voltage level of the collector of said other transistor changes linearly in accordance with said input signal so that current switching is achieved between said transistors to alternately deliver output signals at the output terminals on the collector side of said transistors in accordance with the level of said input signal, and wherein the output terminal of said first current switch circuit corresponding to the said other transistor is coupled to the base of said one transistor of said second current switch circuit so that the output signal of said first current switch circuit serves as the input signal of said second current switch circuit.

10. A logic circuit according to claim 9, wherein biases of said pair of transistors of said each current switch circuit are set on the condition that said pair of transistors be operated in the non-saturation region.

11. A logic circuit according to claim 10, wherein an output signal from any current switch circuit of said plurality of current switch circuits is applied as an input signal to another current switch circuit.

12. A logic circuit according to claim 9, 10 or 11, wherein respective collectors of said pair of transistors of said each current switch circuit are connected through resistors to a first power terminal of a power supply source, and said constant current source is connected with a second power terminal of said power supply source.

13. A logic circuit including a plurality of non-threshold emitter-coupled logic current switch circuits, each of said current switch circuits comprising a pair of transistors, each of said transistors being commonly connected with a constant current source on an emitter side thereof, each collector of said transistors being directly supplied with a constant voltage level through a respective resistor, said resistors being directly connected without any intervening elements to said collectors, each of said transistors delivering an output signal at an output terminal on a collector side thereof, one transistor of a first current switch circuit of said plurality of current switch circuits receiving an input signal at a base thereof, a base and a collector of the other transistor of said first current switch circuit being directly coupled to each other, and respective bases of said pair of transistors included in a second current switch circuit of said plurality of current switch circuits being connected to respective collectors of said pair of transistors included in said first current switch circuit, wherein said respective resistors of the transistors have resistance values near to each other and a voltage level of the collector of said transistor having its base and collector coupled together changes linearly in accordance with said input signal so that current switching is achieved between said transistors to alternately deliver output signals at the output terminals on the collector side of said transistors in accordance with the level of said input signal.

14. A logic circuit according to claim 13, wherein biases of said pair of transistors included in each of said plurality of current switch circuits are set on the condition that said pair of transistors be operated in the non-saturation region.

15. A non-threshold logic emitter-coupled current switch circuit comprising:
a pair of transistors, each of said transistors having a base, an emitter and a collector;
a constant current source commonly connected to the emitter side of said transistors;
input terminal means coupled to one of said pair of transistors for applying an input signal to the base of said one transistor;
means for directly applying a constant voltage level to the collector of each transistor through a respective resistor;
said resistors being directly connected without any intervening elements to said collectors;
feedback means for d.c. coupling the base and the collector of the other of said pair of transistors; and
output terminal means coupled to each of said transistors for deriving an output signal on the collector side thereof,
wherein said respective resistors of the transistors have resistance values near to each other and a voltage level of the collector of said other transistor changes linearly in accordance with said input signal so that current switching is achieved between said transistors to alternately deliver output signals at the output terminals on the collector side of said transistors in accordance with the level of said input signal.

16. A non-threshold emitter-coupled logic current switch circuit comprising at least a pair of transistors, each of said transistors having a base, an emitter and a collector and being commonly connected to a constant current source on its emitter side, each of said transistors delivering an output signal at an output terminal on its collector side, said output signal having an amplitude of 0.4 to 0.5 volts in which the logic circuit operates in a non-saturation region, an input signal being applied to the base of one of said transistors, each collector of said transistors being directly supplied with a constant voltage level through a respective resistor, said resistors being directly connected without any intervening elements to said collectors, and the collector and the base of the other transistor being d.c. coupled directly to each other, wherein said respective resistors of the transistors have resistance values near to each other and a voltage level of the collector of said other transistor changes linearly in accordance with said input signal so that current switching is achieved between said transistors to alternately deliver output signals at the output terminals on the collector side of said transistors in accordance with the level of said input signal, and further wherein the high level and the low level of the input signal are equal to the high level and the low level of the output signal, respectively.

17. A non-threshold logic current switch circuit according to claim 1, 5, 9, 13, 15 or 16, wherein said respective resistors have resistance values which are substantially equal to each other.

* * * * *